United States Patent [19]

Kato

[11] Patent Number: 5,229,334

[45] Date of Patent: Jul. 20, 1993

[54] METHOD OF FORMING A GATE INSULATING FILM INVOLVING A STEP OF CLEANING USING AN AMMONIA-PEROXIDE SOLUTION

[75] Inventor: Juri Kato, Nagano, Japan

[73] Assignee: Seiko Epson Corporation, Tokyo, Japan

[21] Appl. No.: 744,359

[22] Filed: Aug. 13, 1991

[30] Foreign Application Priority Data

Aug. 24, 1990 [JP] Japan .................................. 2-223835

[51] Int. Cl.⁵ .................... H01L 21/306; B08B 3/08
[52] U.S. Cl. ................................ 437/239; 437/946; 134/3; 134/25.4; 134/28
[58] Field of Search ............. 437/239, 946; 134/25.4, 134/28, 3

[56] References Cited

U.S. PATENT DOCUMENTS

| | | | |
|---|---|---|---|
| 3,158,517 | 11/1964 | Schwarzenberger | 134/3 |
| 4,264,374 | 4/1981 | Beyer et al. | 134/4 |
| 4,867,799 | 9/1989 | Grebinski | 437/229 |

OTHER PUBLICATIONS

Moslehi et al., "Interfacial and breakdown characteristics of MOS Devices with rapidly grown Ultrathin SiO₂ Gate Insulators", IEEE Transactions on Electron Devices, vol. ED-34, No. 6, Jun. 1987, pp. 1907-1910.
Wiget et al., "The Influence of Cleaning on SiO₂ Growth", ESSDERC '89 European Solid State Devices Research Conference, Sep. 11, 1989, pp. 370-373.
Shimizu et al., "Effects of Dipping in an Aqueous Hydrofluoric Acid Solution before Oxidation on Minority Carrier Lifetimes in p-Type Silicon Wafers", Japanese Journal of Applied Physics, vol. 28, No. 5.I, May 1989, pp. 743-747.
Hisas, "Thin Film Etching System on Semiconductor Base Plate", Patent Abstracts of Japan, vol. 1, No. 86(E-035) Aug. 11, 1977, (JP-Ap-52022881).
Tatsuro, "Manufacture of Semiconductor Device", Patent Abstracts of Japan, vol. 12, No. 285(E-642), Aug. 4, 1988, (JP-A-63062329).
Watanabe et al., "The Role of Atmospheric Oxgen and Water in the Generation of Water Marks on the Silicon Surface in Cleaning Processes", Materials Science & Engineering, vol. B4, No. 1/4, Oct. 1989, pp. 401-405.
Jiyunji; "Semiconductor Substrate Cleaning Device", Patent Abstracts of Japan, vol. 9, No. 332(E-370), Dec. 26, 1985, JP-A-60163434).
Koji, "Processing of Semiconductor Device", Patent Abstracts of Japan, vol. 11, No. 338(E-53) Nov. 5, 1987, (JP-A-62118528).
Yoshio, "Production of Silicon Dioxide Thin Film", Patent Abstracts of Japan, vol. 4, No. 61(C-009), May 8, 1980, (JP-A-55027854).
Kern, "The Evolution of Silicon Wafer Cleaning Technology", J. Electrochem. Soc. vol. 137, No. 6, Jun. 1990, pp. 1887-1892.
Beyer, "Silicon Surface Cleaning Process", IBM Tech. Disc. Bull., vol. 20, No. 5, 1977, pp. 1746-1747.
Meek et al., "Silicon Surface Contamination: Polishing and Cleaning", J. Electrochem. Soc.: Solid State Science and Technology, vol. 120, No. 9, Sep. 1973, pp. 1291-1246.

Primary Examiner—Olik Chaudhuri
Assistant Examiner—Ourmazd S. Ojan
Attorney, Agent, or Firm—Ladas & Parry

[57] ABSTRACT

A method of producing a semiconductor device which comprises; a first cleaning step of cleaning the surface of Si of a semiconductor device having an Si base or an Si thin film as a substrate (1) by using an APM solution; a second cleaning step of cleaning the surface of Si by using a dilute HF solution to thereby remove the uppermost surface layer (3) of a naturally oxidized film (2) formed in the first cleaning step; and a step of forming a silicon oxide film by thermally oxidizing the cleaned surface of the naturally oxidized film (2).

5 Claims, 5 Drawing Sheets

METHOD OF FORMING A GATE INSULATING FILM INVOLVING A STEP OF CLEANING USING AN AMMONIA-PEROXIDE SOLUTION

BACKGROUND OF THE INVENTION

1. Field of the Invention

The present invention relates to a method of producing a semiconductor device and, particularly, relates to a method of producing a semiconductor device mainly comprising a process which can be suitably adapted to the method of forming thin gate insulating film provided in MOSFETs (MOS field-effect transistors), TFTs (thin-film transistors), etc.

2. Description of the Prior Art

Heretofore, MOSFETs, TFTs, etc. are known as semiconductor devices constituted with silicon (hereinafter abbreviated as "Si") bases or Si thin films as substrates. For example, a dilute hydrofluoric acid solution or an ammonia-peroxide mixture solution is used for wet cleaning of the surface of Si before the formation of gate insulating film (Si oxide film: $SiO_2$ film), in the process of producing such a semiconductor device.

The dilute hydrofluoric acid solution which is generally called "dilute fluoric acid solution" is an aqueous solution of hydrogen fluoride HF and hereinafter abbreviated as "dilute HF solution". The ammonia-peroxide mixture solution is a mixture solution of aqueous ammonia $NH_4OH$ (or ammonia $NH_3$) and hydrogen peroxide $H_2O_2$ and hereinafter abbreviated as "APM (ammonia peroxide mixture) solution".

In the aforementioned conventional cleaning process, it is known that the surface condition of Si after cleaning is characterized (decided) by a solution used for final cleaning. That is, in the case where the dilute HF solution is used for final cleaning, a naturally oxidized film and a surface contamination layer characterized by HF cleaning are formed. In the case where the APM solution is used for final cleaning, a naturally oxidized film and a surface contamination layer characterized by APM cleaning are formed. In the case of APM cleaning, a perfectly clean Si surface cannot be formed so that not only a naturally oxidized film having a thickness of about 10 Å or less remains but a surface having some characteristic exists therein.

In the conventional Si surface cleaning step in the method of producing a semiconductor device, not only naturally oxidized films respectively peculiar to slow etching solutions, such as an APM solution and a dilute HF solution, used as cleaning solutions are formed but surface contamination layers respectively depending on the naturally oxidized films exist. Therefore, the following problem is pointed out.

Though the formation of naturally oxidized film may be unavoidable, the final cleaning with the HF solution has a disadvantage in that the Si surface is hydrophobic and has the property that particles are easily deposited thereon, from the point of view of the microscopic surface form thereof. On the other hand, the cleaning with the APM solution has an advantage in that the Si surface is hydrophilic and has the property that particles are not easily deposited thereon, but the cleaning with the APM solution has a disadvantage in that the Si surface is contaminated with metals such as Fe and Al. In particular, the presence of such metal contamination is a conclusive barrier to the case where a gate oxide film is formed on the Si surface.

That is, such gate oxide film used in MOSFETs and MOS capacitors for memories has been thinned year by year. In particular, in the case of MOS capacitors, the thinning of the gate oxide film is unavoidable for the purpose of increasing the capacity per unit area. The present situation is that the thickness of the oxidized film of about 100 Å is required. Because the aforementioned surface contamination easily induces failure in the insulating property of the oxidized film, a faultless thin oxidized film being free from surface contamination with metals is now required and demanded.

SUMMARY OF THE INVENTION

It is an object of the present invention to solve the above problems.

It is another object of the present invention to provide a method of producing a semiconductor device comprising the cleaning steps in which control can be made so that (a) the Si surface is free or depositing of particles, (b) the Si surface is free from surface contamination, and (c) the Si surface is kept hydrophilic.

In order to attain the above objects, the method of producing a semiconductor device according to the present invention comprises a first cleaning step of cleaning an Si surface of a semiconductor device having an Si base or an Si thin film as a substrate with an APM solution, a second cleaning step of cleaning the Si surface with a dilute HF of solution, and an Si oxide film forming step of forming an Si oxide film by thermally oxidizing the cleaned surface. In this case, the dilute HF solution may contain $H_2O_2$. In the second cleaning step, it is preferable that a thickness of from 20% to 80% is removed from the surface of the naturally oxidized film formed on the Si surface by the first cleaning step.

In the present invention, the step of cleaning with the APM solution, the step of cleaning with the dilute HF solution and the step of thermal oxidation are successively carried out. That is, basically, a naturally oxidized film free from contamination is made to remain as an Si base surface protecting film for forming a thermally oxidized film, by applying the dilute HF solution to the naturally oxidized film produced by the cleaning with the APM solution to remove the surface contamination region of the naturally oxidized film. A good-quality thin Si oxide film can be produced by forming a thermally oxidized film under the protecting film.

Describing more in detail, a clean naturally oxidized film of the order of several Å is made to remain by: removing particles by cleaning with the APM solution to form an about 10 Å-thick naturally oxidized film on the Si surface; and then removing about 3 Å from the surface layer as the metal contamination region of the naturally oxidized film, by cleaning with the dilute HF solution. Accordingly, the Si surface still exhibits hydrophilic property after the cleaning with the dilute HF solution, so that the depositing of particles can be avoided. Accordingly, the cleaning of the Si surface being free from the depositing of particles and free from contamination and having hydrophilic property can be made. That is, the method of producing a semiconductor device according to the present invention is characterized in that the contaminated uppermost surface layer is simply removed with the dilute HF solution based upon the finding that the surface contamination caused by the cleaning with the APM solution exists only in the uppermost surface region (about 3 Å) of the naturally oxidized film.

DESCRIPTION OF A PREFERRED EMBODIMENT

Figure 1:
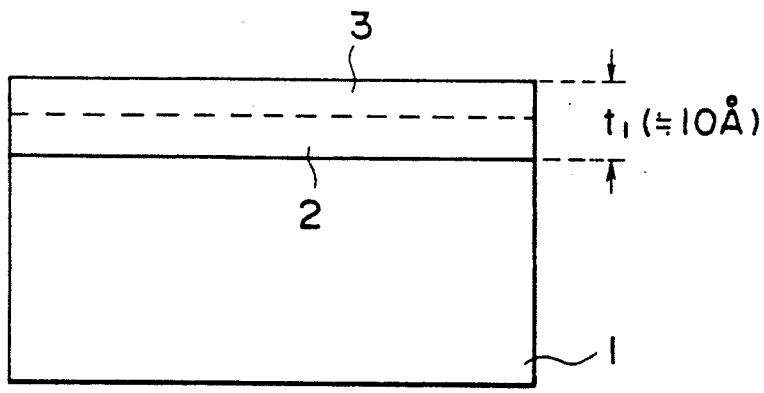
FIG. 1 is a sectional view for explaining the first cleaning step in a method of producing a semiconductor device according to the present invention.
Figure 2:
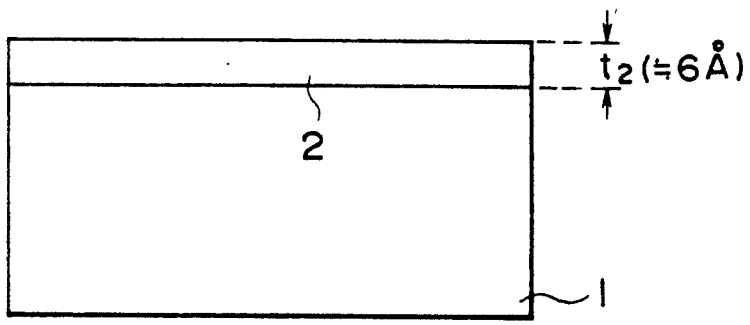
FIG. 2 is a sectional view for explaining the second cleaning step following the step depicted in FIG. 1.
Figure 3:
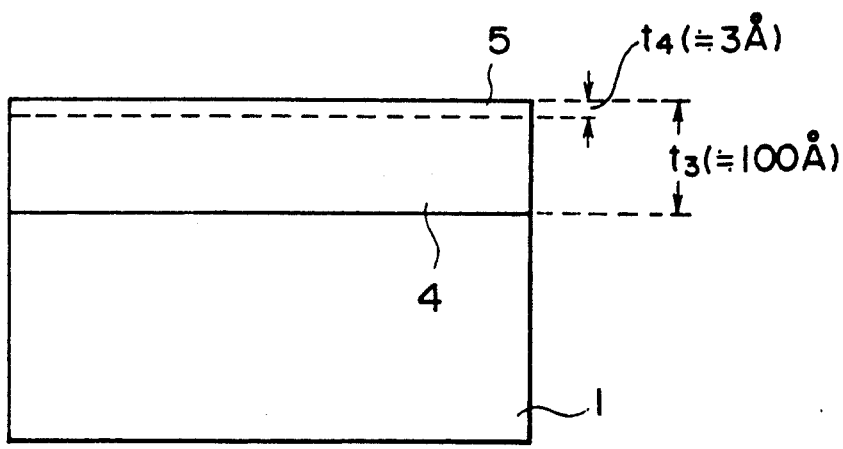
FIG. 3 is a sectional view for explaining the thermally oxidizing step following the step depicted in FIG. 2.

A method of producing a semiconductor device according to the present invention will be described hereunder with reference to an embodiment thereof. FIGS. 1 to 3 are sectional views showing the process of producing (the step of cleaning) a semiconductor device.

In FIG. 1, a subbing layer 2 and an uppermost surface layer 3 of a naturally oxidized film with a thickness $t_1$ of about 10 Å in total are formed on a surface of an Si base 1 after the Si base 1 is treated with an APM solution ($NH_4OH:H_2O_2: H_2O = 1:1:6$, 60° C.) for 3 minutes, in an LSI forming process. Then, in FIG. 2, the uppermost surface layer 3 of the naturally oxidized film is removed by application of etching with a dilute HF solution ($HF:H_2O = 1:200$, 23.5° C.) for 5 seconds. As will be described later, the uppermost surface layer 3 is contaminated with metals such as Al and Fe, but the subbing layer ($t_2 \approx 6$ Å) of the naturally oxidized film is formed as a clean naturally oxidized film.

Then, a thermally oxidized film 4 and an uppermost surface layer 5 of the thermally oxidized film with a thickness $t_3$ of about 100 Å in total as shown in FIG. 3 are formed by thermally oxidizing the Si base 1 in the condition of FIG. 2.

As will be described later, the thickness of the uppermost surface layer 5 of the thermally oxidized film $t_4$ is about 3 Å but the area of the uppermost surface layer 5 is so influenced by the naturally oxidized film formed by the pre-cleaning that Al and negative charge caused by Al exist in the area. The uppermost surface layer 5 having such charge is removed by application of the dilute HF solution ($HF:H_2O = 1: 200$) for 10 seconds. As a result, a clean thermally oxidized film being free from both contamination and charge existing in the naturally oxidized film 3 peculiarly formed by the pre-cleaning as shown in FIG. 1 can be formed. The thermally oxidized film is particularly useful as gate insulating thin film used in MOSFETs and TFTs.

If the dilute HF solution used for the final cleaning is replaced by an aqueous solution consisting of 1:1:2-00 mixture of HF, $H_2O_2$ and $H_2O$, the uppermost surface layer 5 of the thermally oxidized film and the thermally oxidized film 4 can be etched so more softly that an arbitrary thickness (for example, in a range of from 20% to 80%) of the thermally oxidized film can be removed from the surface thereof to control the thickness thereof.

In the following, the results of various examinations on the degree of cleanliness are described.

Figure 4:
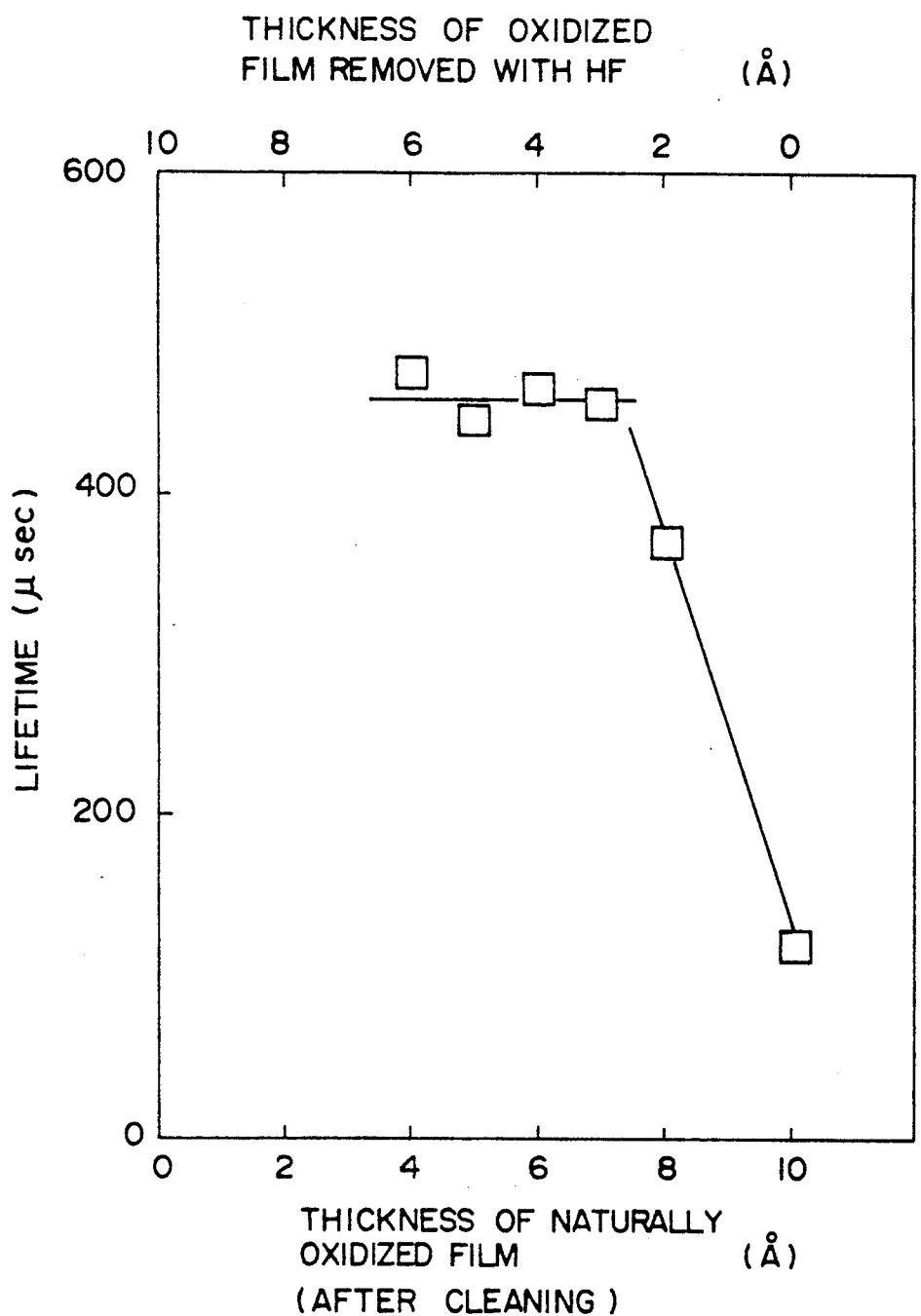
FIG. 4 is a graph showing the relationship between the thickness of a naturally oxidized film formed by the pre-cleaning according to the present invention and the lifetime thereof.

FIG. 4 is a graph showing the relationship between the thickness of the naturally oxidized film formed by the precleaning and the lifetime of a carrier of an Si wafer. An Si wafer having a naturally oxidized film with a thickness of 10 Å is prepared by treating a (100N-type Si base with an APM solution ($NH_4OH:H_2O_2:H_2O = 1:1:6$, 60° C.) for 3 minutes. After the cleaning with the APM solution, the Si wafer is treated with a dilute HF solution ($HF:H_2 = 1:200$) to remove the surface of the naturally oxidized film. The graph in FIG. 4 shows the results of measurement of the lifetime of a carrier of the Si wafer by utilizing $\mu$-wave reflection after treating the Si wafer having the remaining naturally oxidized film in a thickness range of 4 Å to 8 Å with dry $O_2$ (1000° C., 60 minutes). In the graph, the ordinate represents the lifetime ($\mu$ sec) and the lower abscissa represents the thickness of the naturally oxidized film remaining at the surface of the wafer after the cleaning with the APM solution or dilute HF solution. Further, the upper abscissa represents the thickness of oxidized film removed with the HF solution.

As is obvious from FIG. 4, the lifetime after the cleaning with the APM solution is short (about 100 $\mu$sec) because it is considered that contamination with metals forming a deep level is caused by the cleaning. On the other hand, in the case where about 32 Å of the naturally oxidized film is removed with the dilute HF solution, the lifetime exceeds 400 $\mu$ sec which is equal to the lifetime is the case where the naturally oxidized film is perfectly removed with the dilute HF solution. Also in the case where about 2 Å is removed, the lifetime is recovered to about 400 $\mu$ sec. Accordingly, with respect to the naturally oxidized film after the cleaning with the APM solution, it is considered that contamination exists locally in the about 3 Å-thick area of the uppermost surface layer in the naturally oxidized film. Therefore, such contamination can be avoided by removing about 20% from the surface naturally oxidized film.

Figure 5:
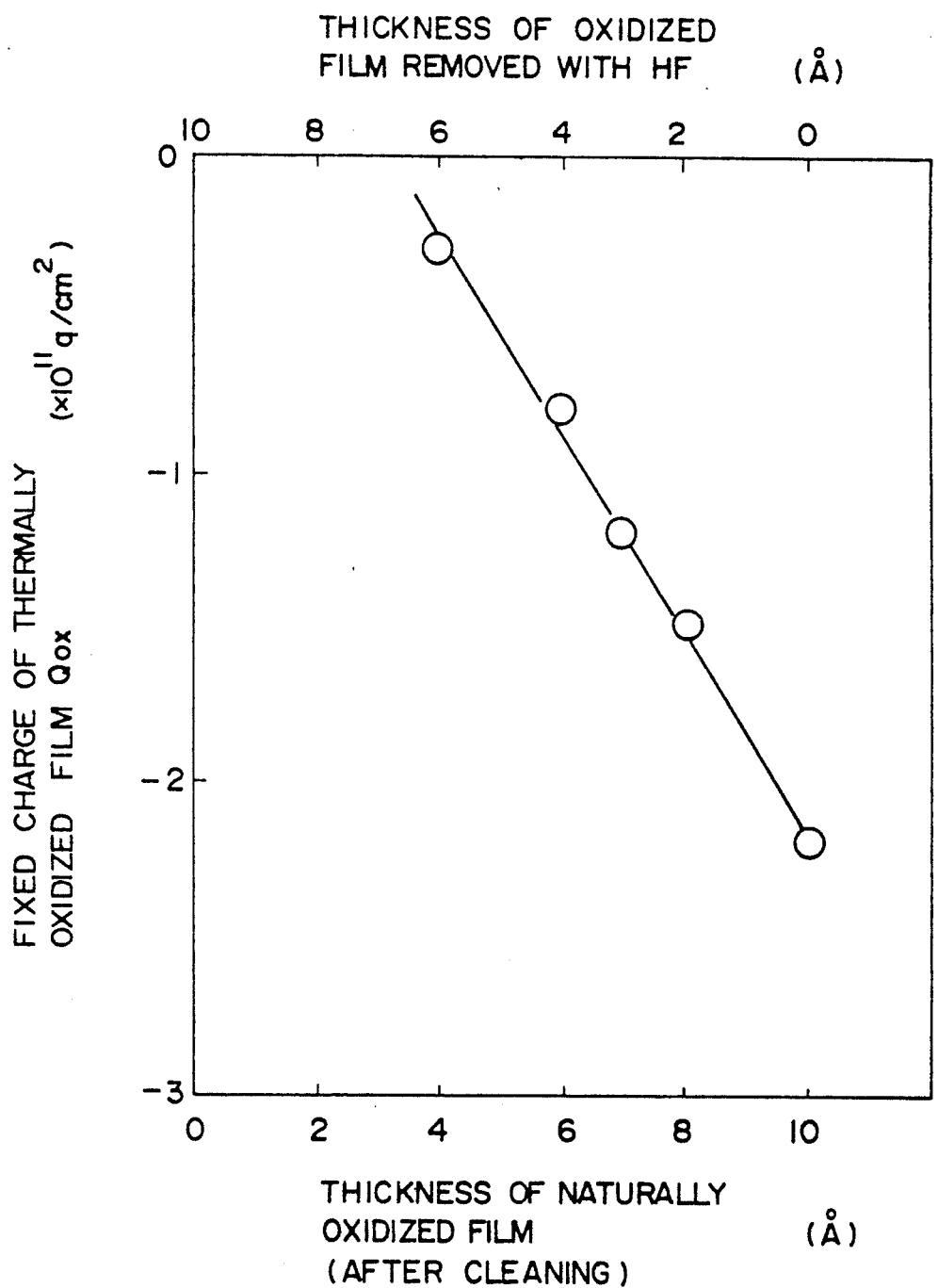
FIG. 5 is a graph showing the relationship between the naturally oxidized film according to the present invention and the fixed charge in the oxidized film.

FIG. 5 is a graph showing the relationship between the thickness of the naturally oxidized film formed by the precleaning and the fixed charge (Qox) in the oxidized film. In the graph, the pre-cleaning condition and the abscissa are similar to those in FIG. 4 and the ordinate represents the fixed charge (Qox) in the oxidized film measured by an SPV method (surface photo voltage method) after an Si water cleaned with an APM solution or a dilute HF solution is treated with dry $O_2$ (900° C., 15 minutes) in the same manner as described above.

With respect to the charge Qox, the pre-cleaning has an effect on about 5A of the uppermost surface layer in the thermally oxidized film. Though the cause of the charge is unknown, negative charge is produced when Al exists in the uppermost surface of the thermally oxidized film. It is considered that the negative charge depends on the presence of AlSiO, OH group and O group in the naturally oxidized film. It is therefore supposed that the negative charge is used as a standard for judgement as to whether particles can be easily deposited on the Si surface. As is obvious from FIG. 5, a large amount of negative charge exists in the wafer cleaned with the APM solution and the negative charge decreases substantially proportionally to the removed amount of the naturally oxidized film gradually cleaned with the dilute HF solution. That is, impurities such as Al causing the negative charge exist substantially uniformly in the direction of the depth of the naturally oxidized film cleaned with the APM solution.

The fact that particles related to the charge are not easily deposited on the cleaned Si surface means the fact that there is little change if about 32 Å of the uppermost surface layer is removed from the naturally oxidized film. It is considered that the Si surface exhibits hydrophilic property because Si—O—Si group or Si—O—H group exists in the remaining naturally oxidized film. It is supposed that 20% or more of the naturally oxidized film formed by the cleaning with the APM solution must be secured in order to keep the Si base hydrophilic.

Figure 6:
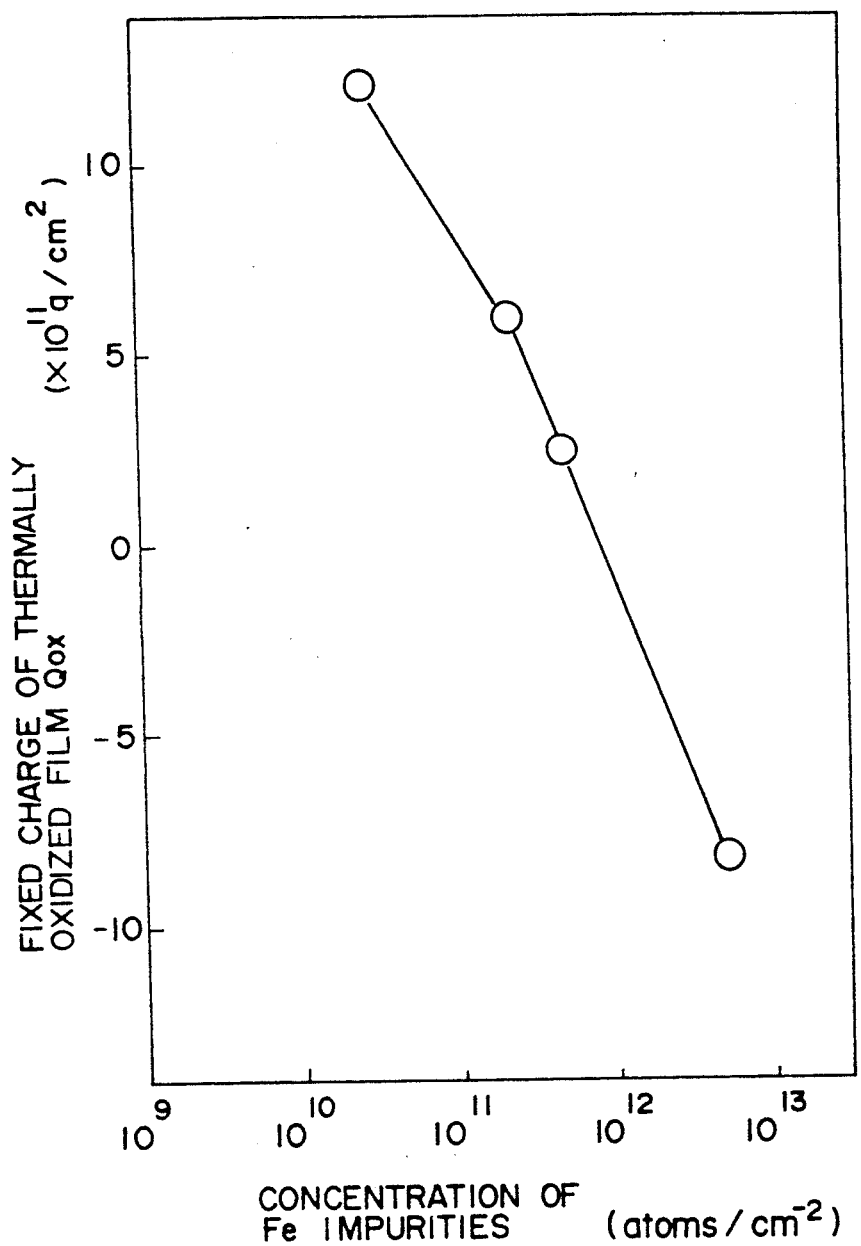
FIG. 6 is a graph showing the relationship between the concentration of Fe in the oxidized film according to the present invention and the fixed charge in the oxidized film.

As related to this, the result of examination of the relationship between the existing amount of Fe and the charge $Q_{ox}$ will be described in the case where Fe is considered as impurities causing the negative charge. FIG. 6 is a graph showing the relationship between the concentration of Fe and the fixed charge $Q_{ox}$ in the oxidized film. In the graph, the abscissa represents the concentration of Fe and the ordinate represents the fixed charge.

As is obvious from FIG. 6, the negative charge in the naturally oxidized film on the surface of the Si base increases as the existing (contamination) amount of Fe on the surface of the Si base increases. That is, it is considered that Fe exhibits the negative charge when Fe is enclosed in the naturally oxidized film. Even if the contamination amount of Fe is not more than $10^{11}$ cm$^{-2}$, the negative charge changes. It is apparent from this that Fe atoms of the order of $10^{10}$ cm$^{-2}$ in that naturally oxidized film on the surface of the Si base can be detected by measurement using the surface photo voltage (SPV). It is found that the fixed charge $Q_{ox}$ has a good correlation with the amount of impurities (matter) exhibiting the negative charge. Though Fe is similarly enclosed in the thermally oxidized film, Fe in the thermally oxidized film does not cause the negative charge.

Figure 7:
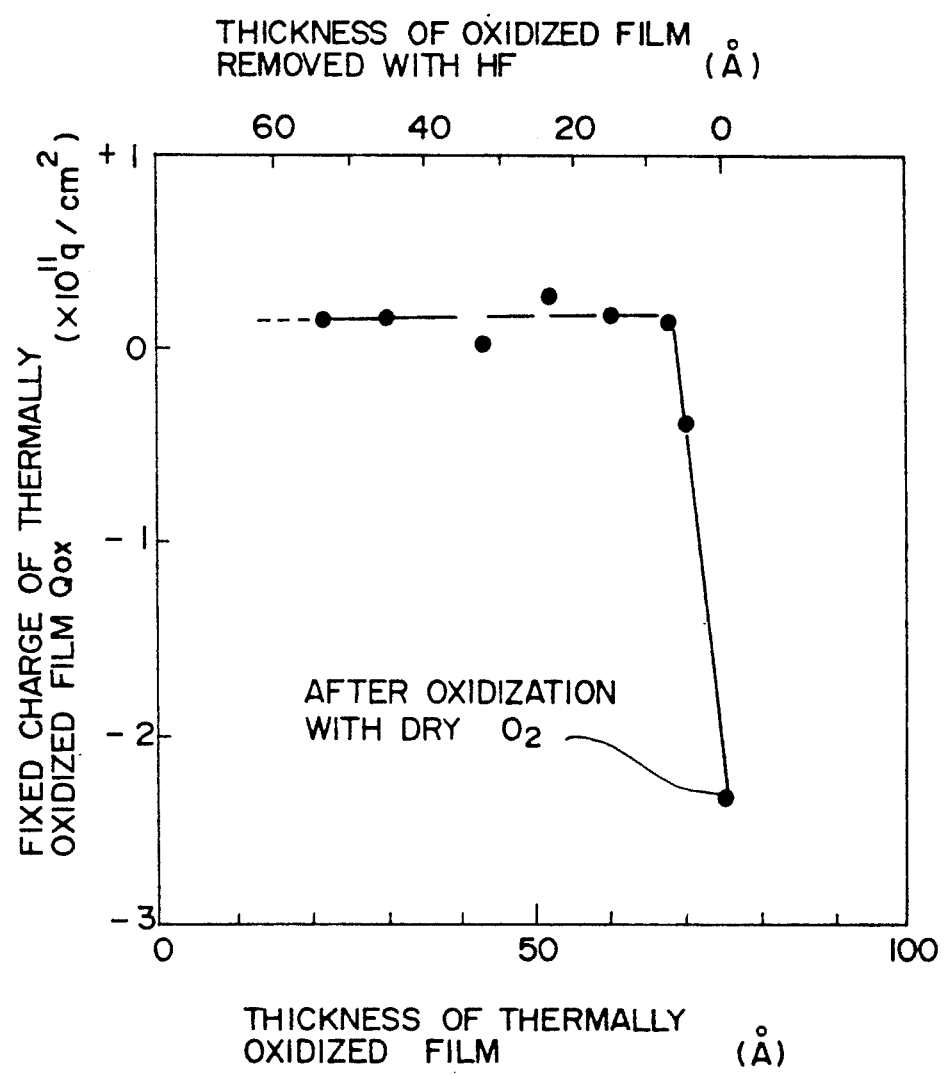
FIG. 7 is a graph showing the relationship between the thermally oxidized film according to the present invention and the fixed charge in the oxidized film.

FIG. 7 is a graph showing the relationship between the thickness of the thermally oxidized film and the fixed charge $Q_{ox}$. The fixed charge $Q_{ox}$ is evaluated by the SPV method, with respect to an Si wafer prepared by cleaning a (100)N-type Si base with an APM solution (NH$_4$OH:H$_2$O$_2$:H$_2$O=1:1:6, 60° C.) for 3 minutes and then forming thermally oxidized film with a thickness of 75 Å (by treatment with dry O$_2$ at 900° C. for 15 minutes). Then, the fixed charge $Q_{ox}$ for each sample prepared by gradually removing the thermally oxidized film through treatment with a dilute HF solution (HF:H$_2$O=1:200) is evaluated. In FIG. 7, the lower abscissa represents the thickness of the thermally oxidized film remaining after thermal oxidation or HF etching, and the upper abscissa represents the thickness of the oxidized film removed with the dilute HF solution. The ordinate represents the fixed charge $Q_{ox}$ of the thermally oxidized film in each sample.

As is obvious from FIG. 7, the negative charge exists in the region of the surface layer (about 5 Å) in the thermally oxidized film. The charge of the uppermost surface layer in the thermally oxidized film depends on the cleaning (pre-cleaning) before oxidation. In the case of cleaning with the APM solution, negative charge as shown in FIG. 7 is exhibited. Though not shown, in the case of cleaning with an HF solution or a hydrochloric acid-peroxide mixture solution, positive charge is exhibited. Because the charge, in any case, exists in the uppermost surface layer in the thermally oxidized film, it is considered that the naturally oxidized film produced by the cleaning before oxidation remains in the uppermost surface layer in the thermally oxidized film after thermal oxidation and causes the fixed charge $Q_{ox}$. In the case of cleaning with the APM solution, it is found that Al exists in the uppermost surface of the thermally oxidized film and causes the negative charge.

Although the aforementioned embodiment has shown the case where oxidized film is formed on an Si base, it is a matter of course that the same process can be applied to the cleaning process in the case where oxidized film is formed on an Si thin film.

As described above, in the method of producing a semiconductor device according to the present invention, a thin oxidized film is formed by the steps of: removing particles by cleaning with an ammonia-peroxide mixture solution; removing about 20% or more of the contamination layer (surface) of a naturally oxidized film formed by the cleaning with the ammonia-peroxide mixture solution, to keep a clean naturally oxidized film (SiO$_x$) (in the amount of at least 20% of the subbing layer of the naturally oxidized film) by cleaning with a dilute HF solution; and applying thermal oxidation. Further, the naturally oxidized film component (SiO$_x$) existing in the uppermost surface of the thermally oxidized film is removed with a dilute HF solution. Accordingly, a reliable SiO$_2$ film which is free from both depositing of particles and contamination and is clean against contamination of the naturally oxidized film with impurities can be produced by the present invention. Accordingly, the invention has an effect that a producing process for attaining high reliability can be established in the case where the process is adapted to LSIs constituted by MOSFETs, TFTs, etc.

What is claimed is:

1. A method of fabricating a semiconductor device comprising:
   a first step of cleaning a surface of a silicon body using an ammonia-peroxide solution and producing, by the cleaning step, a first layer of naturally formed oxide having a first thickness on said surface,
   a second step of removing, by use of a dilute hydrofluoric acid solution, a preselected thickness of said first layer while leaving a portion of said first layer on and protecting said surface; and
   a step of then forming a second layer of silicon oxide on said surface by thermal oxidation.

2. A method according to claim 1 including, after forming said second layer, removing a preselected thickness from an upper portion of said second layer.

3. A method according to claim 1 wherein said dilute hydrofluoric acid solution includes hydrogen peroxide acid.

4. A method according to claim 2 wherein a dilute hydrofluoric acid solution is used for removing said preselected thickness from the upper portion of said second layer.

5. A method according to claim 1 wherein said preselected thickness of said first layer removed during said second step is within the range from 1 Å to 8 Å.

* * * * *